US010629500B2

(12) United States Patent
Soss et al.

(10) Patent No.: US 10,629,500 B2
(45) Date of Patent: Apr. 21, 2020

(54) PRODUCT THAT INCLUDES A PLURALITY OF VERTICAL TRANSISTORS WITH A SHARED CONDUCTIVE GATE PLUG

(71) Applicant: GLOBALFOUNDRIES Inc., Grand Cayman (KY)

(72) Inventors: Steven Soss, Cornwall, NY (US); Steven Bentley, Menands, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 16/538,041

(22) Filed: Aug. 12, 2019

(65) Prior Publication Data

US 2020/0013684 A1    Jan. 9, 2020

Related U.S. Application Data

(63) Continuation of application No. 16/027,834, filed on Jul. 5, 2018, now Pat. No. 10,446,451.

(51) Int. Cl.
*H01L 21/8238* (2006.01)
*H01L 29/66* (2006.01)
*H01L 29/08* (2006.01)
*H01L 21/768* (2006.01)

(52) U.S. Cl.
CPC ........ *H01L 21/823885* (2013.01); *H01L 21/76829* (2013.01); *H01L 29/0847* (2013.01); *H01L 29/6656* (2013.01); *H01L 29/66545* (2013.01); *H01L 29/66666* (2013.01)

(58) Field of Classification Search
CPC ....... H01L 21/823885; H01L 29/66666; H01L 29/6656; H01L 21/76829; H01L 29/0847; H01L 29/66545
See application file for complete search history.

(56) References Cited

U.S. PATENT DOCUMENTS

| | | |
|---|---|---|
| 9,362,355 B1 | 6/2016 | Cheng et al. |
| 9,704,754 B1 | 7/2017 | Bao et al. |
| 9,911,815 B2 | 3/2018 | Nidhi et al. |
| 9,953,973 B1 | 4/2018 | Balakrishnan et al. |
| 10,020,198 B1 | 7/2018 | Wang et al. |

(Continued)

FOREIGN PATENT DOCUMENTS

| | | |
|---|---|---|
| TW | 201607037 A | 2/2016 |
| TW | 201733117 A | 9/2017 |
| TW | 201824447 A | 7/2018 |

OTHER PUBLICATIONS

Examination Report from Taiwan Application No. 108119516 dated Jan. 16, 2020.

*Primary Examiner* — Karen Kusumakar
(74) *Attorney, Agent, or Firm* — Amerson Law Firm, PLLC (57) ABSTRACT

The present disclosure is directed to various embodiments of a product that includes first and second vertical semiconductor structures for first and second, respectively, vertical transistor devices, and first and second gate structures positioned adjacent the first and second, respectively, vertical semiconductor structures. The product also includes a shared conductive gate plug positioned laterally between the first gate structure and the second gate structure, wherein the shared conductive gate plug is conductively coupled to both the first gate structure and the second gate structure.

20 Claims, 11 Drawing Sheets

(56) References Cited

U.S. PATENT DOCUMENTS

| | | |
|---|---|---|
| 2006/0091432 A1 | 5/2006 | Guha et al. |
| 2017/0288031 A1 | 10/2017 | Ho et al. |
| 2017/0358607 A1* | 12/2017 | Balakrishnan ...... H01L 27/1207 |
| 2018/0315757 A1 | 11/2018 | Rachmady et al. |

* cited by examiner

PRODUCT THAT INCLUDES A PLURALITY OF VERTICAL TRANSISTORS WITH A SHARED CONDUCTIVE GATE PLUG

BACKGROUND

1 Field of the Disclosure

The present disclosure generally relates to the fabrication of semiconductor devices, and, more particularly, to a product that includes a plurality of vertical transistor devices with a shared conductive gate plug.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout. Field effect transistors (NMOS and PMOS transistors) represent one important type of circuit element that substantially determines performance of such integrated circuits. During the fabrication of complex integrated circuits using, for instance, MOS technology, millions of transistors, e.g., NMOS transistors and/or PMOS transistors, are formed on a substrate including a crystalline semiconductor layer. A field effect transistor, whether an NMOS or a PMOS device, is a planar device that typically includes a source region, a drain region, a channel region that is positioned between the source region and the drain region, and a gate structure positioned above the channel region. The gate structure is typically comprised of a very thin gate insulation layer and one or more conductive layers that act as a conductive gate electrode. In a field effect transistor, the conductivity of the channel region, i.e., the drive current capability of the conductive channel, is controlled by applying an appropriate voltage to the gate electrode.

Field effect transistors come in a variety of different configurations, e.g., planar devices, FinFET devices, vertical transistor devices, etc. As technology advances, there is a constant demand to reduce the overall size of the IC products to reduce the size of the consumer products incorporating such IC products. Vertical transistor devices, with their vertically oriented channel structure, present one promising choice for advanced IC products given the potential space savings achieved by using such devices. Modern integrated circuit (IC) products typically include a very large number of active individual circuit elements, such as field effect transistors, as well as numerous passive circuit elements, such as capacitors, resistors and the like. These circuit elements are combined in various arrangements to make integrated circuits that perform a variety of functions so as to enable the IC product to perform its intended function.

To balance the threshold voltages of CMOS devices, different gate materials are typically used for PMOS versus NMOS devices. The gate materials are generally formed using a replacement gate process that replaces a placeholder material with the desired gate materials. Due to the space constraints associated with vertical transistor devices, it is difficult to implement a replacement gate process to form different gate materials.

The present disclosure is directed to various methods and resulting devices that may avoid, or at least reduce, the effects of one or more of the problems identified above.

SUMMARY

The following presents a simplified summary of illustrative embodiments of the invention in order to provide a basic understanding of some aspects of the illustrative embodiments of the invention. This summary is not an exhaustive overview of the illustrative embodiments of the invention specifically discussed herein. It is not intended to identify key or critical elements of the invention or to delineate the scope of the invention. Its sole purpose is to present some concepts in a simplified form as a prelude to the more detailed description that is discussed later.

Generally, the present disclosure is directed to various embodiments of a method for forming replacement gate structures for vertical transistors as well as various methods of forming a product that includes a plurality of vertical transistor devices with a shared conductive gate plug. One illustrative method disclosed herein includes, among other things, forming first and second vertical semiconductor structures, forming first and second sacrificial spacers adjacent channel regions of the first and second vertical semiconductor structures, respectively, forming a ring spacer adjacent the first and second sacrificial spacers, removing end portions of the ring spacer to expose end portions of the first and second sacrificial spacers, replacing the first sacrificial spacer with a first replacement gate structure including a first gate insulation layer and a first conductive gate material, replacing the second sacrificial spacer with a second replacement gate structure including a second gate insulation layer and a second conductive gate material, removing remaining portions of the ring spacer to define a spacer cavity, and forming a dielectric material in the spacer cavity.

One illustrative product disclosed herein includes a first vertical semiconductor structure, a first bottom source/drain region positioned adjacent the first vertical semiconductor structure, a second vertical semiconductor structure and a second bottom source/drain region positioned adjacent the second vertical semiconductor structure. In this embodiment, the product also includes a bottom spacer positioned above the first and second bottom source/drain regions and a shared conductive gate plug positioned laterally between the first gate structure and the second gate structure, the shared conductive gate plug being conductively coupled to both the first gate structure and the second gate structure.

Another illustrative product disclosed herein includes a first vertical semiconductor structure, a first bottom source/drain region positioned adjacent the first vertical semiconductor structure, a first top source/drain region positioned on an upper surface of the first vertical semiconductor structure, a second vertical semiconductor structure, a second bottom source/drain region positioned adjacent the second vertical semiconductor structure, and a second top source/drain region positioned on an upper surface of the second vertical semiconductor structure. In this embodiment, the product also includes a bottom spacer positioned above the first and second bottom source/drain regions, a shared conductive gate plug positioned laterally between the first gate structure and the second gate structure, the shared conductive gate plug being conductively coupled to both the first gate structure and the second gate structure, and an isolation break positioned vertically below at least a portion of the shared conductive gate plug and laterally between the first bottom source/drain region and the second bottom source/drain region, wherein the isolation break comprises an insulating material.

Yet another illustrative product disclosed herein includes an N-type vertical transistor device including a first vertical semiconductor structure, a first bottom source/drain region positioned adjacent the first vertical semiconductor structure and a first top source/drain region positioned on an upper surface of the first vertical semiconductor structure, and a P-type vertical transistor device including a second vertical semiconductor structure, a second bottom source/drain region positioned adjacent the second vertical semiconductor structure, and a second top source/drain region positioned on an upper surface of the second vertical semiconductor structure. In this embodiment, the product also includes a bottom spacer positioned above the first and second bottom source/drain regions and a shared conductive gate plug positioned laterally between the first gate structure and the second gate structure, the shared conductive gate plug being conductively coupled to both the first gate structure and the second gate structure.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific and illustrative embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. The various layers of material described below may be formed by any of a variety of different known techniques, e.g., a chemical vapor deposition (CVD) process, an atomic layer deposition (ALD) process, a thermal growth process, epitaxial growth processes, spin-coating techniques, etc. Moreover, as used herein and in the attached claims, the word "adjacent" is to be given a broad interpretation and should be interpreted to cover situations where one feature actually contacts another feature or is in close proximity to that other feature.

Figure 1:
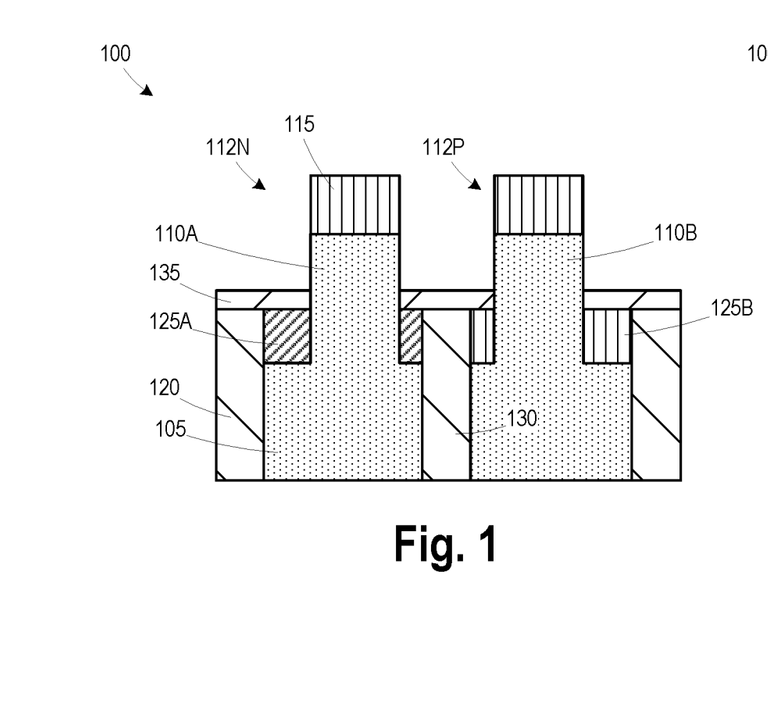
FIGS. 1-22 are cross-section and top views depicting various methods disclosed herein of forming replacement gate structures for vertical transistors as well as various methods of forming a product that includes a plurality of vertical transistor devices with a shared conductive gate plug.

FIGS. 1-22 depict the various embodiments of a method for forming replacement gate structures for vertical transistors in an integrated circuit device 100 formed on a substrate 105. FIG. 1 shows a cross-sectional view of the device 100 along the axial length of two adjacent illustrative fins 110A, 110B. In the illustrative embodiment, the fin 110A is part of a vertical N-type transistor 112N, and the fin 110B is part of a vertical P-type transistor 112P. The N-type transistor 112N and the vertical P-type transistor 112P cooperate to define an inverter, which is a foundational element in a memory cell. Of course, the methods described herein may be applied to other circuit elements. A hard mask layer 115 (e.g., a stack including a layer of silicon dioxide and a layer of silicon nitride) was formed above the substrate 105 and patterned to define fin openings forming the fins 110A, 110B.

The fins 110A, 110B were formed within an active region bounded by an isolation structure 120 (e.g., silicon dioxide). Bottom source/drain regions 125A, 125B doped according to the type of the transistor were formed at the base of the fins 110A, 110B. An isolation break 130 was formed to separate the bottom source/drain regions 125A, 125B disposed between the fins 110A, 110B. A bottom spacer 135 (e.g., silicon dioxide) was formed above the bottom source/drain regions 125A, 125B.

The substrate 105 may have a variety of forms, such as the bulk substrate illustrated. The substrate 105 may also have a silicon-on-insulator (SOI) configuration that includes a bulk silicon layer, a buried insulation layer and an active layer, wherein semiconductor devices are formed in and above the active layer. The substrate 105 may be formed of silicon or silicon germanium or it may be made of materials other than silicon, such as germanium. Thus, the terms "substrate" or "semiconductor substrate" should be understood to cover all semiconducting materials and all forms of such materials. The substrate 105 may have different layers. For example, the fins 110A, 110B may be formed in a process layer formed above the base layer of the substrate 105. In general, the fins 110A, 110B represent vertically oriented semiconductor structures. Other vertical structures may be employed, such as pillars.

Figure 2:
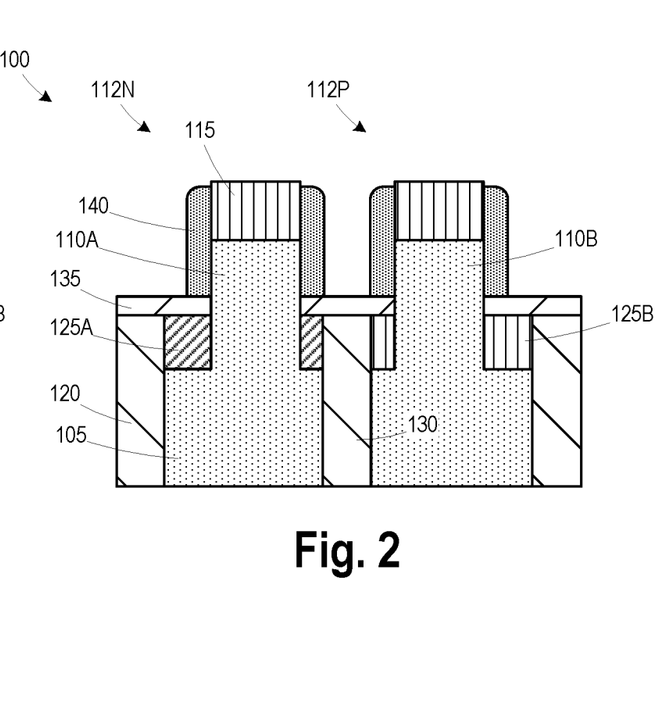

FIG. 2 illustrates the product 100 after several processes were performed to define sacrificial spacers 140 (e.g., low temperature oxide (LTO)) around the fins 110A, 110B. A deposition process was performed to form a layer of spacer material, and an anisotropic etch process was performed to remove horizontal portions of the layer of spacer material, leaving the sacrificial spacers 140. The sacrificial spacers 140 serve as placeholders for the subsequently formed gate structures.

Figure 3:
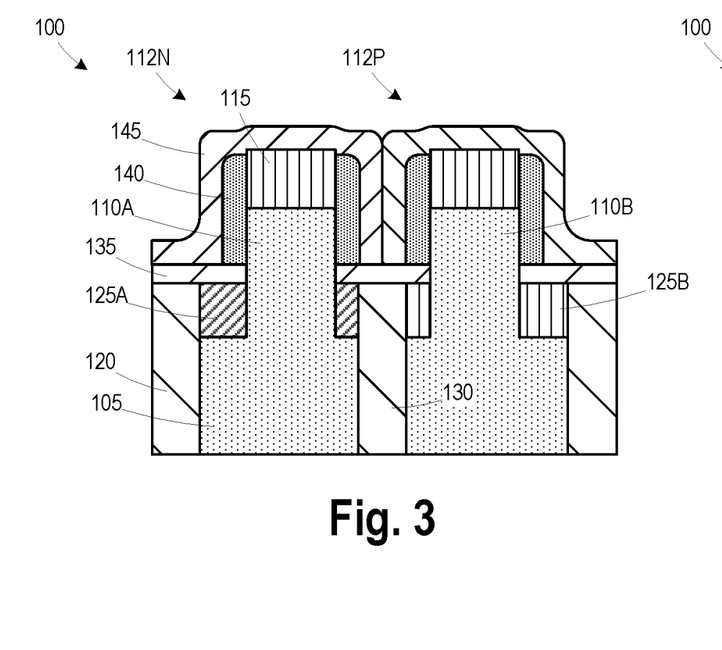

FIG. 3 illustrates the product 100 after several processes were performed. Processes similar to those described in reference to FIG. 2 were performed to define ring spacers 145 (e.g., amorphous silicon) around and above the sacrificial spacers 140. The ring spacers 145 merge in the region between the fins 110A, 110B. The ring spacers 145 allow independent access to the sacrificial spacers 140 for a replacement gate process described in greater detail below.

Figure 4:
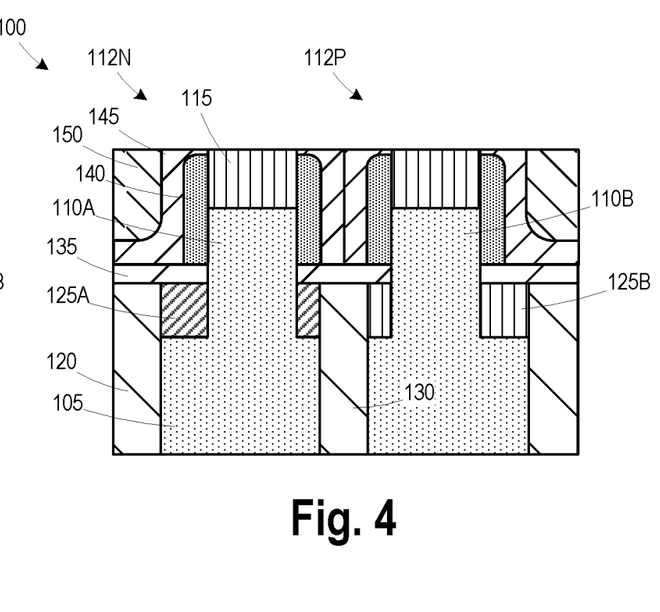

FIG. 4 illustrates the product 100 after a deposition process was performed to form a dielectric layer 150 adjacent the fins 110A, 110B. A planarization process was performed to planarize the dielectric layer 150 and expose the hard mask layer 115 and the ring spacers 145.

Figure 5:
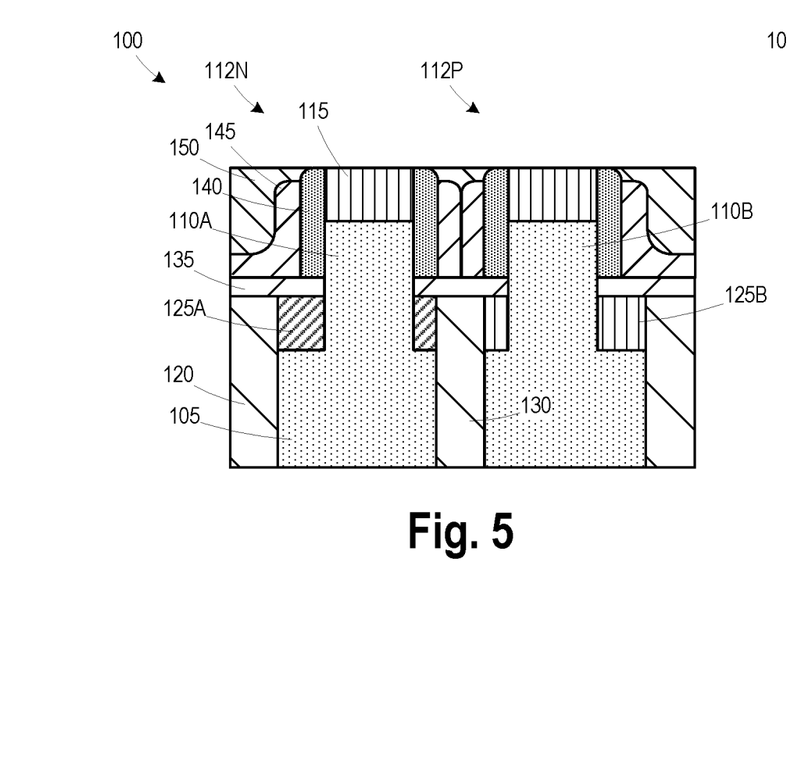

FIG. 5 illustrates the product 100 after several process were performed. An etch process was performed to selectively recess the ring spacers 145. A deposition process was performed to fill in the recessed regions formed in the dielectric layer 150, and another planarization process was performed to re-planarize the dielectric layer 150 and expose the hard mask layer 115 and the sacrificial spacers 140.

Figure 6:
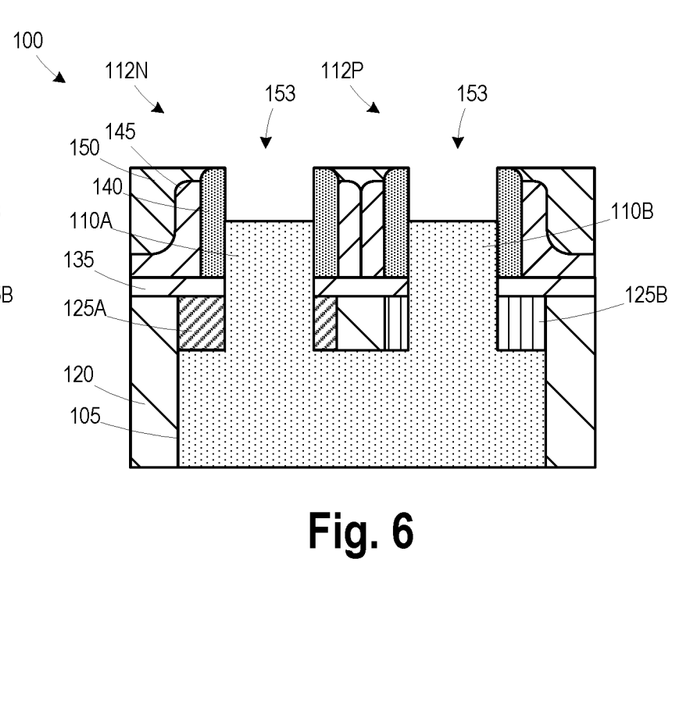

FIG. 6 illustrates the product 100 after a selective etch process was performed to remove the hard mask layer 115 to define cap cavities 153.

Figure 7:
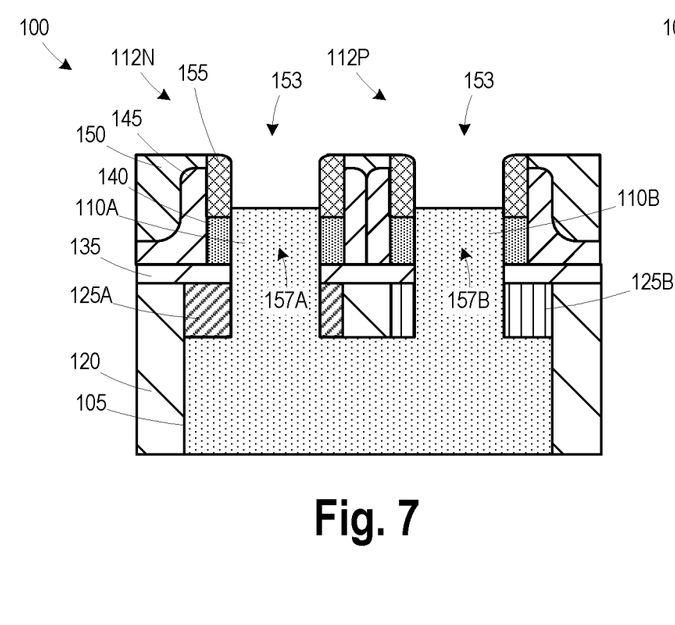

FIG. 7 illustrates the product 100 after several processes were performed. A selective etch process was performed to recess the sacrificial spacers 140. The sacrificial spacers 140 are recessed to a height corresponding a channel length of the transistors 112N, 112P. Processes similar to those described in reference to FIG. 2 were performed to define inner spacers 155 (e.g., silicon nitride) above the recessed sacrificial spacers 140. Thus, the sacrificial spacers 140 are positioned adjacent channel regions 157A, 157B of the fins 110A, 110B.

Figure 8:
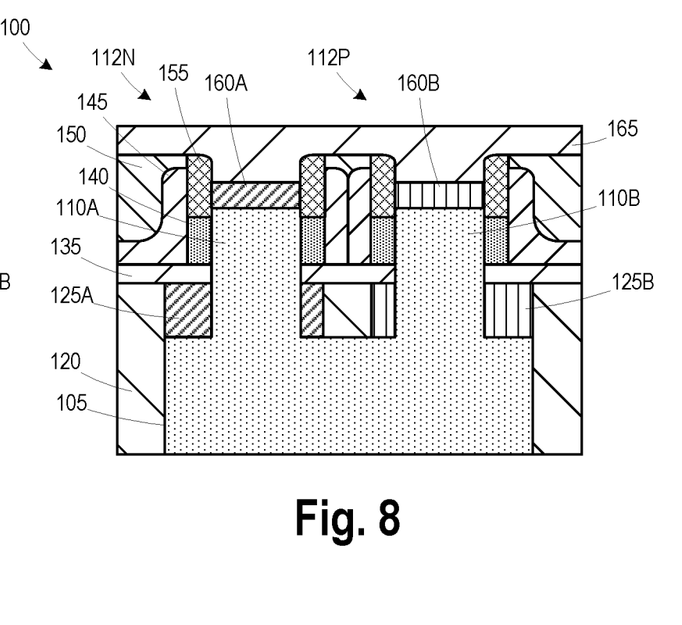

FIG. 8 illustrates the product 100 after several processes were performed. Epitaxial growth processes were performed (i.e., using masks) to formed doped epitaxial material for top source/drain regions 160A, 160B. A deposition process was performed to form a cap layer 165 (e.g., silicon nitride) above the top source/drain regions 160A, 160B and above the dielectric layer 150.

Figure 9:
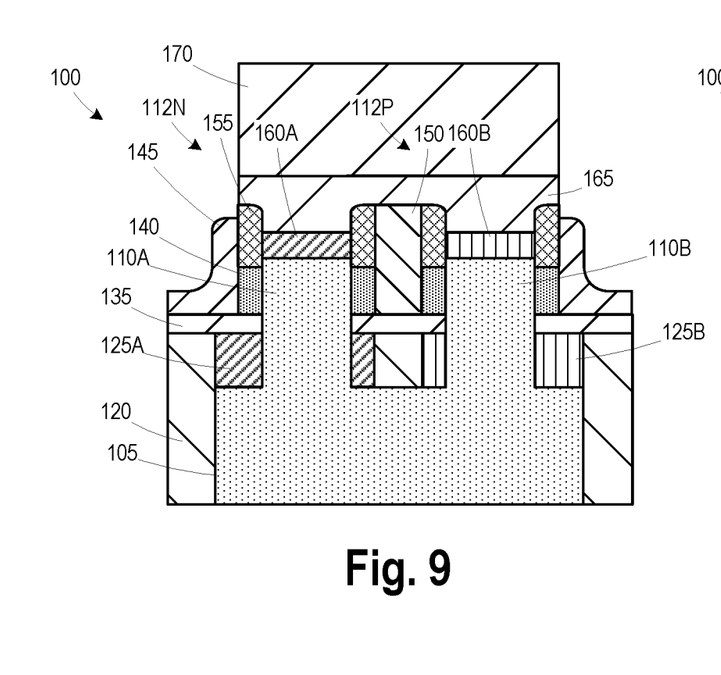

FIG. 9 illustrates the product 100 after a mask 170 was formed to cover the fins 110A, 110B, while leaving regions above end portions of the ring spacers 145 uncovered. One or more etch processes were performed to etch the cap layer 165 and the dielectric layer 150 to expose the ends of the ring spacers 145.

Figure 10:
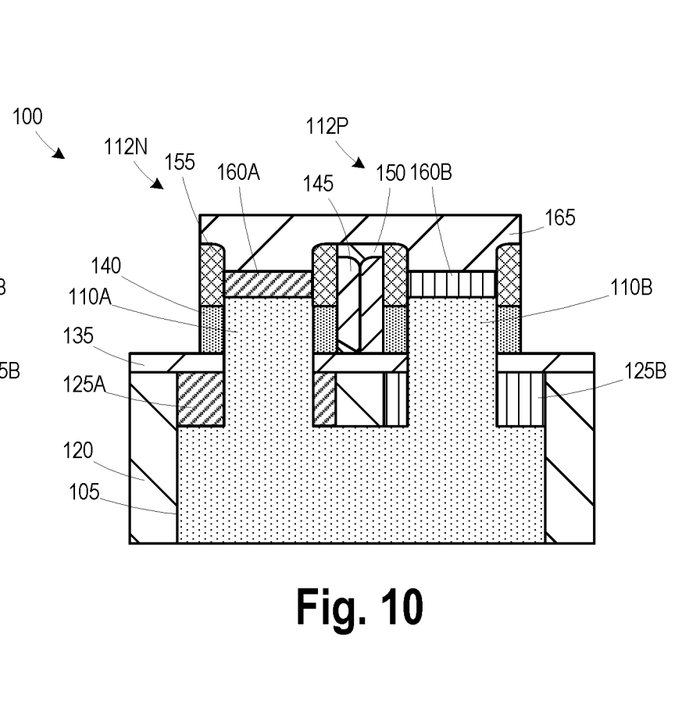

FIG. 10 illustrates the product 100 after one or more selective etch processes were performed to remove exposed portions of the ring spacers 145 and to remove the mask layer 170. The removal of the ring spacers 145 exposes the sacrificial spacers 140.

Figure 11:
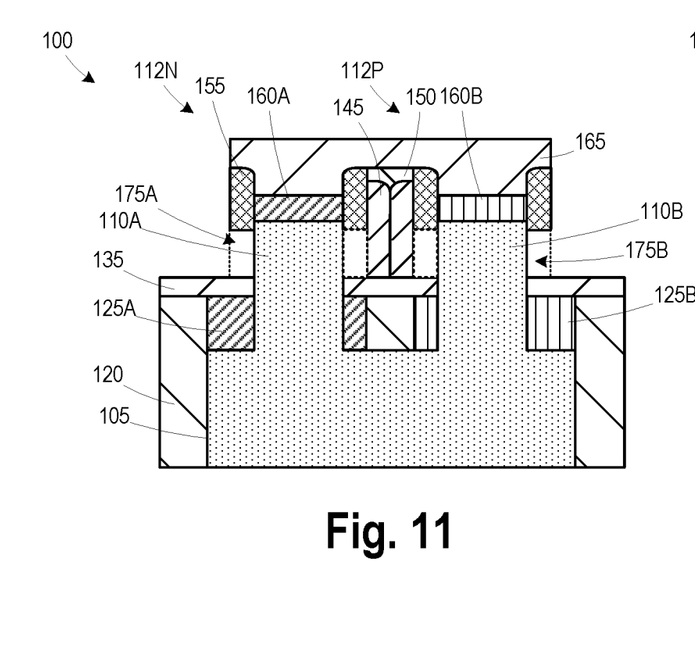

FIG. 11 illustrates the product 100 after a wet etch process was performed to remove the sacrificial spacers 140 to define gate cavities 175A, 175B that surround the respective fins 110A, 110B. The gate cavities 175A, 175B are bounded by remaining portions of the ring spacers 145.

Figure 12:
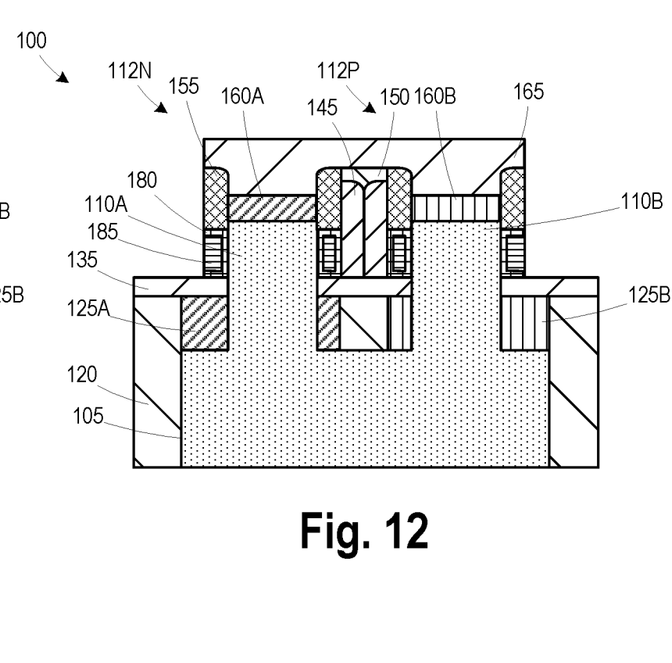

FIG. 12 illustrates the product 100 after several processes were performed. A deposition process was performed to form gate insulation layer 180 (e.g., high-k material, such as hafnium oxide) in the gate cavities 175A, 175B. One or more deposition processes were performed to form a first work function material (WFM) layer 185 (e.g., conductive gate material) over the gate insulation layer 180 in the gate cavities 175A, 175B and to overfill the gate cavities 175A, 175B. An etch process was performed to remove portions of the WFM layer 185 and the gate insulation layer 180 not disposed in the gate cavities 175A, 175B. The WFM layer 185 may be a single material or a stack of different layers. An example WFM material for a N-type device includes TiN.

Figure 13:
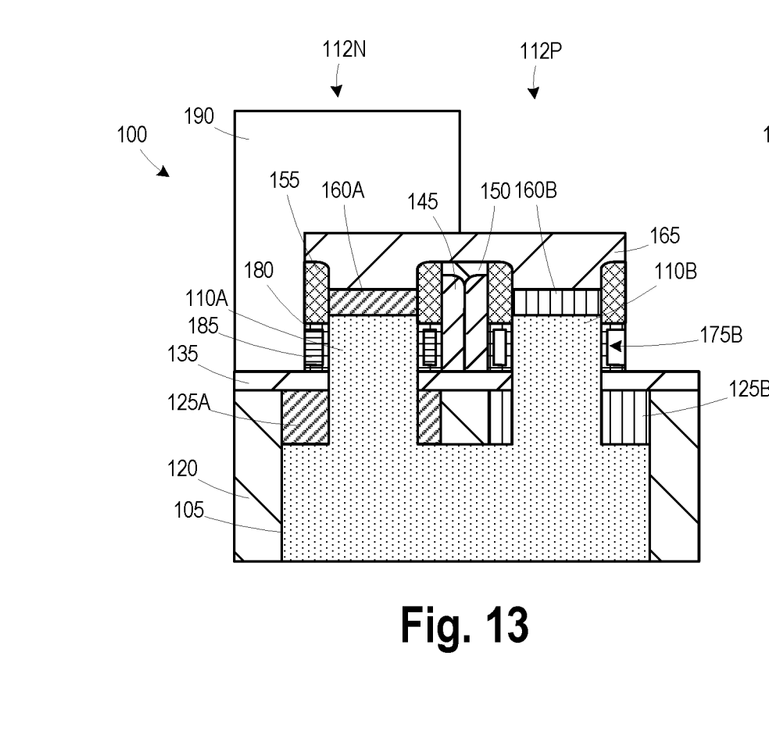

FIG. 13 illustrates the product 100 after a patterned mask 190 (e.g., organic patterning layer (OPL)) was formed above the transistor 112N, thereby covering the WFM layer 185 in the gate cavity 175A and exposing the WFM layer 185 in the gate cavity 175B. A selective wet etch process was performed to remove the WFM layer 185 from the gate cavity 175B, thereby reopening the gate cavity 175B.

Figure 14:
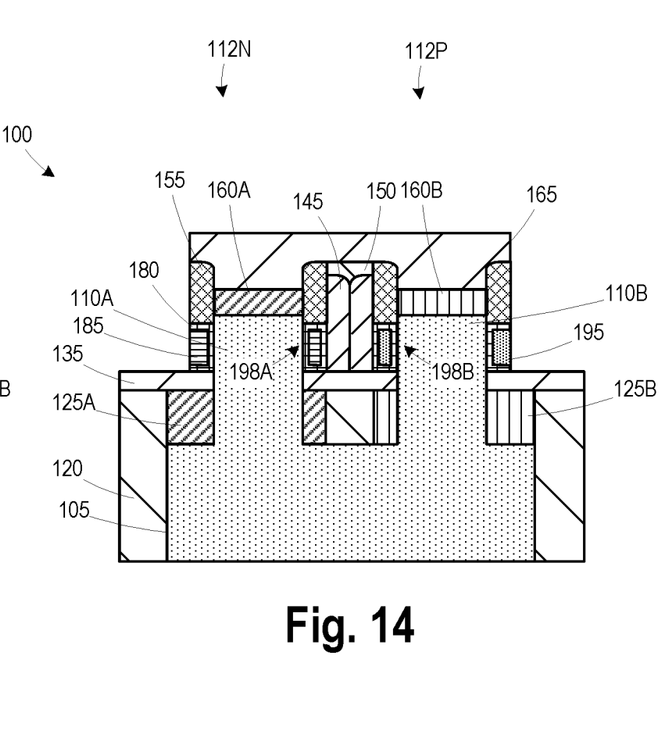

FIG. 14 illustrates the product 100 after several processes were performed. The mask 190 was stripped. One or more deposition processes were performed to form a second work function material (WFM) layer 195 (e.g., conductive gate material) over the gate insulation layer 180 in the gate cavity 175B and to overfill the gate cavity 175B. An etch process was performed to remove portions of the WFM layer 195 not disposed in the gate cavity 175B. The WFM layer 195 may be a single material or a stack of different layers. An example WFM material for an N-type device include a stack of layers, such as TiN/TiC/TiN. In some embodiments, the removal of the remaining portions of the gate insulation layer 180 may occur after the forming and removal of excess portions of the second WFM layer 195. The gate insulation layer 180 and the WFM layers 185, 195, define gate structures 198A, 198B, respectively.

Figure 15:
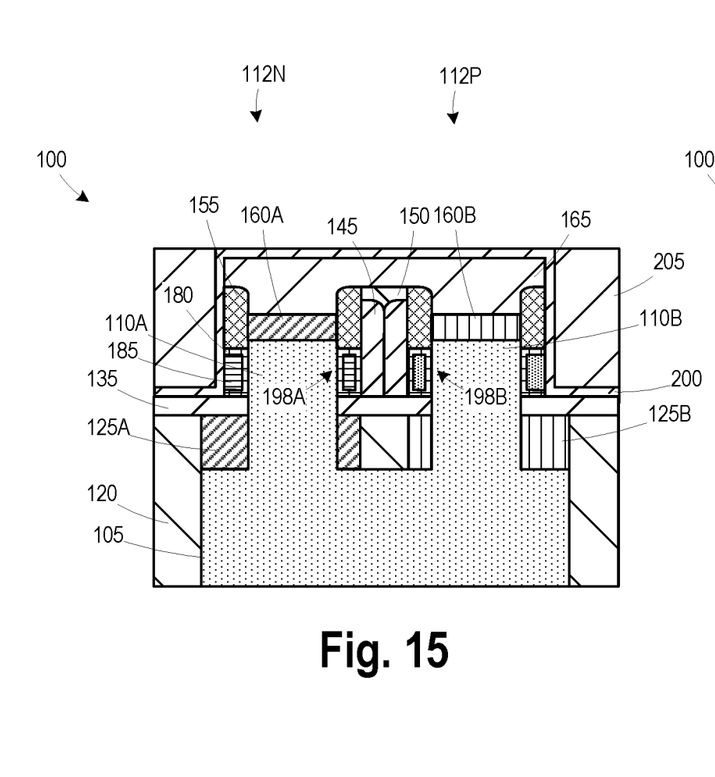

FIG. 15 illustrates the product 100 after a first deposition process was performed to form a liner layer 200 (e.g., low-k dielectric) and a second deposition process was performed to form a dielectric layer 205 above the liner layer 200. A planarization process was performed to remove portions of the dielectric layer 205 above the transistors 112N, 112P.

Figure 16:
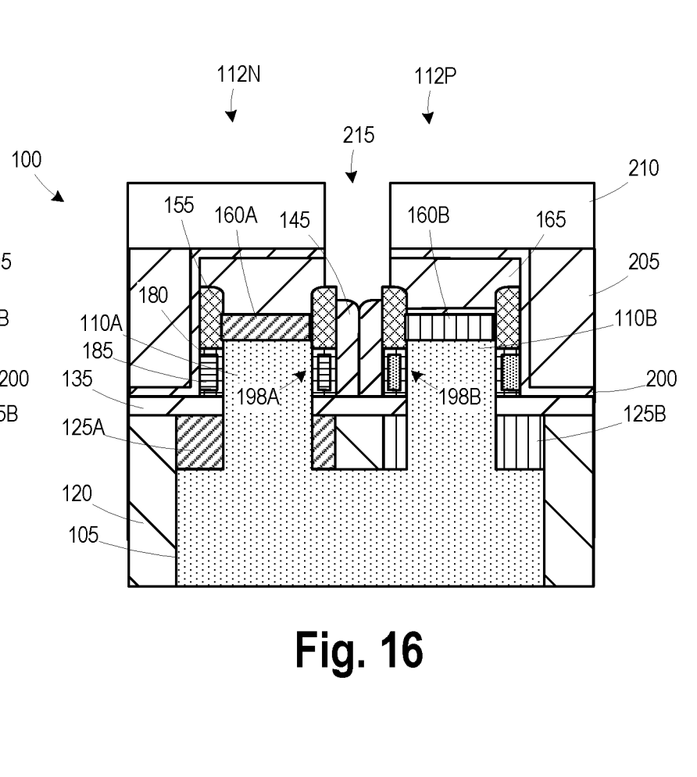

FIG. 16 illustrates the product 100 after a patterned mask layer 210 was formed above the liner layer 200. The mask layer 210 has an opening 215 positioned above the center portion of the ring spacer 145 disposed between the gate structures 198A, 198B. One or more etch processes were performed to remove the portions of the liner layer 200, the cap layer 165, and the dielectric layer 150 to expose the ring spacer 145.

Figure 17:
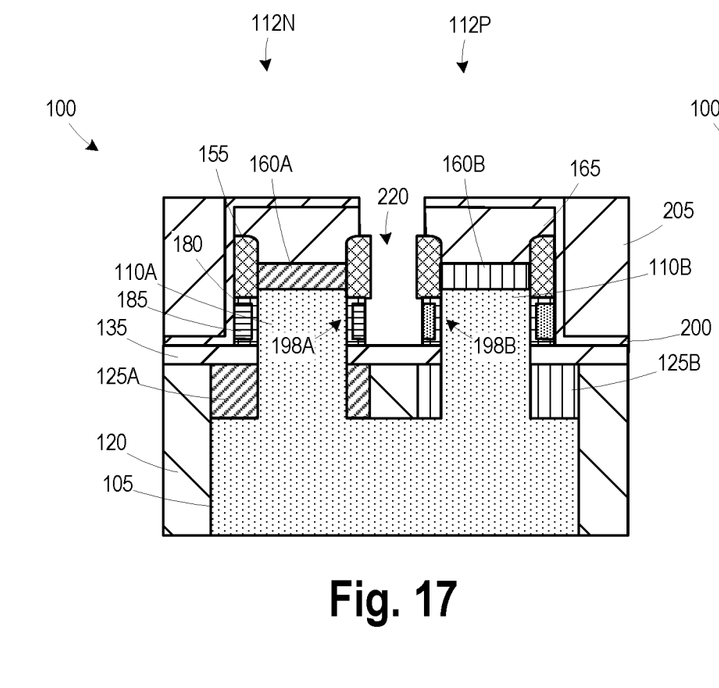

FIG. 17 illustrates the product 100 after several processes were performed. A strip process was performed to remove the mask layer 210. An anisotropic etch process was performed through the opening 215 to remove a portion of the ring spacer 145 between the gate structures 198A, 198B to define a contact cavity 220. An etch process was performed to remove portions of the gate insulation layer 180 exposed by the contact cavity 220.

Figure 18:
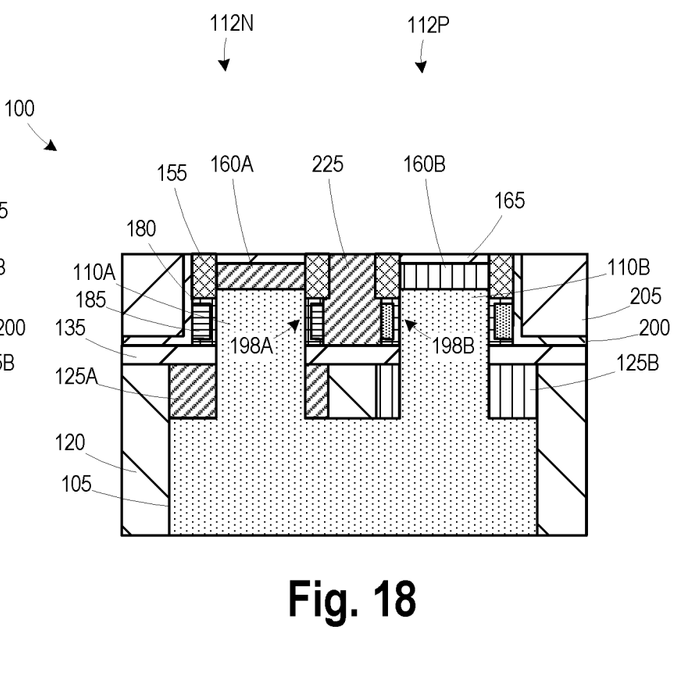
Figure 19:
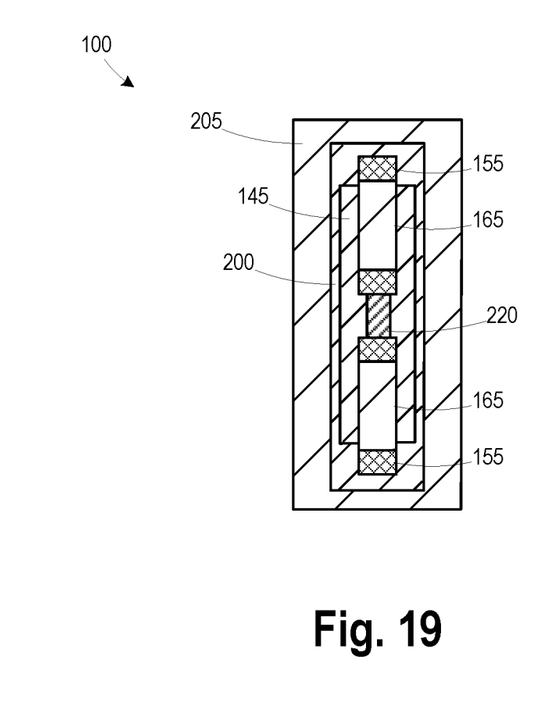

FIGS. 18 and 19 illustrate the product 100 after several processes were performed. One or more deposition processes were performed to deposit a conductive material in the contact cavity 220 to define a gate plug 225 that conductively couples the gate structures 198A, 198B, thereby forming a shared gate structure. The gate plug 225 may include a liner material (e.g., Ti) and a fill material (e.g., tungsten). A planarization process was performed to remove excess portions of the conductive material outside the contact cavity 220 and to remove portions of the liner layer 200, and the dielectric layer 205, to expose remaining portions of the ring spacers 145. The ring spacers 145 are not visible in the cross-section of FIG. 18, as they are positioned in front of and behind the fins 110A, 110B. FIG. 19 is a top view of the product 100 illustrating the remaining portions of the ring spacers 145 after the planarization process was performed.

Figure 20:
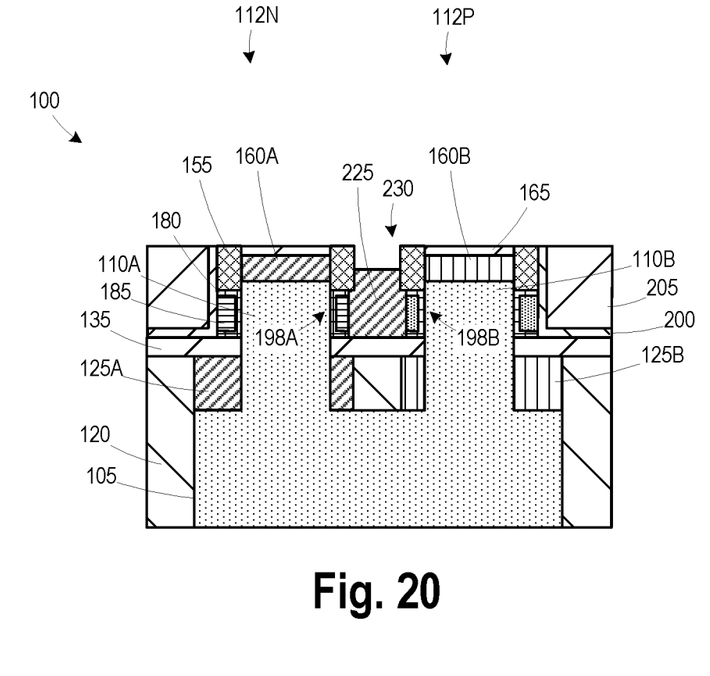

FIG. 20 illustrates the product 100 after an optional etch process was performed to recess the gate plug 225 to define a cavity 230.

Figure 21:
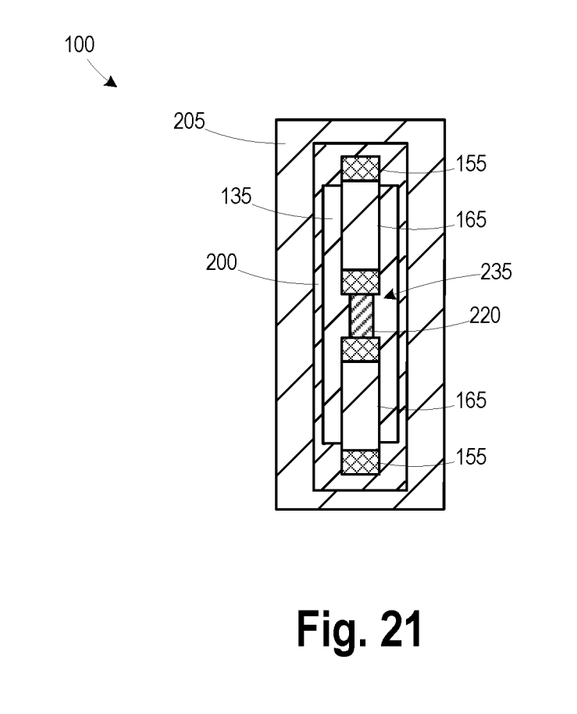

FIG. 21 illustrates a top view of the product 100 after an etch process was performed to remove remaining portions of the ring spacers 145, thereby exposing the underlying bottom spacer 135 and defining a spacer cavity 235.

Figure 22:
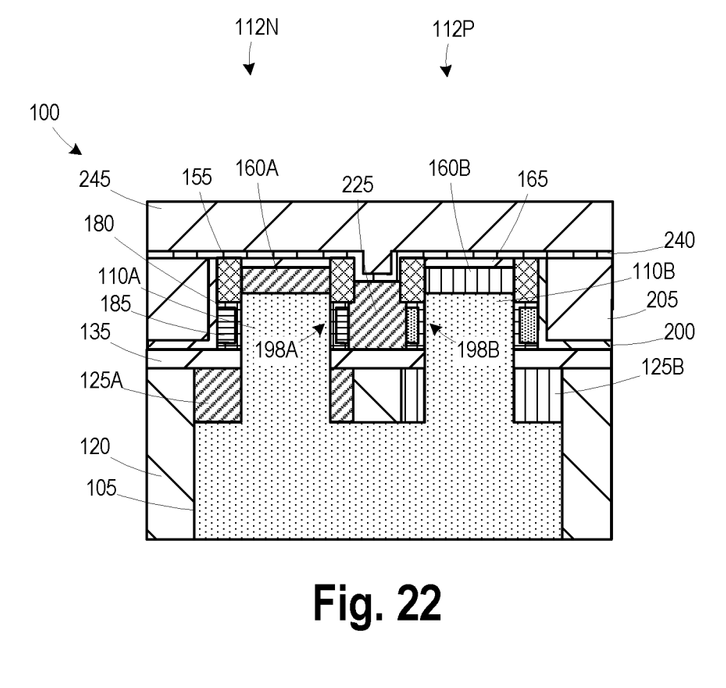

FIG. 22 illustrates the product 100 after a first deposition process was performed to form a liner layer 240 (e.g., low-k dielectric) in the cavities 230, 235 and a second deposition process was performed to form a dielectric layer 245 above the liner layer 240. A planarization process was performed to planarize the dielectric layer 245.

The use of the ring spacers 145 as described herein allows the fabrication of the replacement gate structures 198A, 198B to be performed independently, allowing the device characteristics, such as threshold voltage, to be independently controlled. Although the device 100 is illustrated as having a P-type transistor 112P adjacent an N-type transistor 112N with a shared gate configuration, the use of the ring spacer 145 to provide replacement gate flexibility may be provided for any type of device. Moreover, the shared gate configuration is also optional. The gate plug 225 may be constructed to contact only one of the replacement gate structures 198A, 198B. The process is not limited to just providing different gate materials for two different replacement gate structures 198A, 198B. The selective masking and iterative deposition and removal steps may be repeated for any number of replacement gate structures.

Additional process steps may be performed to complete the fabrication of the device 100. For example, additional contacts may be formed to contact the bottom source/drain regions 125A, 125B, the top source/drain regions 160A, 160B, the gate plug 225, etc.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A product, comprising:
a first vertical semiconductor structure;
a first bottom source/drain region positioned adjacent the first vertical semiconductor structure;
a second vertical semiconductor structure;
a second bottom source/drain region positioned adjacent the second vertical semiconductor structure;
a bottom spacer positioned above the first and second bottom source/drain regions; and
a shared conductive gate plug positioned laterally between the first gate structure and the second gate structure, the shared conductive gate plug being conductively coupled to both the first gate structure and the second gate structure.

2. The product of claim 1, wherein the first vertical semiconductor structure is a portion of a first vertical transistor device and wherein the second vertical semiconductor structure is a portion of a second vertical transistor device.

3. The product of claim 2, wherein the first vertical transistor device is an N-type device and the second vertical transistor device is a P-type device.

4. The product of claim 1, wherein materials of construction for the first gate structure and the second gate structure are the same.

5. The product of claim 1, wherein the first gate structure comprises a first work-function material layer and the second gate structure comprises a second work-function material layer that is different from the first work-function material layer.

6. The product of claim 1, further comprising an isolation break positioned vertically below at least a portion of the shared conductive gate plug and laterally between the first bottom source/drain region and the second bottom source/drain region, wherein the isolation break comprises an insulating material.

7. The product of claim 1, further comprising:
a first top source/drain region positioned on an upper surface of the first vertical semiconductor structure; and
a second top source/drain region positioned on an upper surface of the second vertical semiconductor structure.

8. The product of claim 7, further comprising first and second cap layers positioned above the first and second top source/drain regions, respectively.

9. The product of claim 5, wherein one or both of the first and second work-function material layers comprises a stack of layers.

10. A product, comprising:
a first vertical semiconductor structure;
a first bottom source/drain region positioned adjacent the first vertical semiconductor structure;
a first top source/drain region positioned on an upper surface of the first vertical semiconductor structure;
a second vertical semiconductor structure;
a second bottom source/drain region positioned adjacent the second vertical semiconductor structure;
a second top source/drain region positioned on an upper surface of the second vertical semiconductor structure;
a bottom spacer positioned above the first and second bottom source/drain regions;
a shared conductive gate plug positioned laterally between the first gate structure and the second gate structure, the shared conductive gate plug being conductively coupled to both the first gate structure and the second gate structure; and
an isolation break positioned vertically below at least a portion of the shared conductive gate plug and laterally between the first bottom source/drain region and the second bottom source/drain region, wherein the isolation break comprises an insulating material.

11. The product of claim 10, wherein the first vertical semiconductor structure is a portion of a first vertical transistor device and wherein the second vertical semiconductor structure is a portion of a second vertical transistor device.

12. The product of claim 11, wherein the first vertical transistor device is an N-type device and the second vertical transistor device is a P-type device.

13. The product of claim 10, wherein materials of construction for the first gate structure and the second gate structure are the same.

14. The product of claim 10, wherein the first gate structure comprises a first work-function material layer and the second gate structure comprises a second work-function material layer that is different from the first work-function material layer.

15. The product of claim 14, wherein one or both of the first and second work-function material layers comprises a stack of layers.

16. A product, comprising:
an N-type vertical transistor device, comprising:
a first vertical semiconductor structure;
a first bottom source/drain region positioned adjacent the first vertical semiconductor structure; and
a first top source/drain region positioned on an upper surface of the first vertical semiconductor structure;
a P-type vertical transistor device, comprising:
a second vertical semiconductor structure;
a second bottom source/drain region positioned adjacent the second vertical semiconductor structure; and
a second top source/drain region positioned on an upper surface of the second vertical semiconductor structure;
a bottom spacer positioned above the first and second bottom source/drain regions; and
a shared conductive gate plug positioned laterally between the first gate structure and the second gate structure, the shared conductive gate plug being conductively coupled to both the first gate structure and the second gate structure.

17. The product of claim 16, wherein materials of construction for the first gate structure and the second gate structure are different.

18. The product of claim 16, wherein the first gate structure comprises a first work-function material layer and the second gate structure comprises a second work-function material layer that is different from the first work-function material layer.

19. The product of claim 16, further comprising an isolation break positioned vertically below at least a portion of the shared conductive gate plug and laterally between the first bottom source/drain region and the second bottom source/drain region, wherein the isolation break comprises an insulating material.

20. The product of claim 18, wherein one or both of the first and second work-function material layers comprises a stack of layers.

* * * * *